United States Patent [19]
Cole et al.

[11] Patent Number: 5,858,074
[45] Date of Patent: Jan. 12, 1999

[54] ORGANIC SOLDERABILITY PRESERVATIVE COMPOSITIONS

[75] Inventors: Kenneth C. Cole; Éric Pellerin, both of Québec, Canada

[73] Assignee: National Research Council of Canada, Ottawa, Canada

[21] Appl. No.: 902,198

[22] Filed: Jul. 29, 1997

[51] Int. Cl.$^6$ .............................. C23F 11/00; C08K 5/16
[52] U.S. Cl. .................... 106/14.42; 106/14.15; 106/14.16; 106/14.41; 106/14.43; 252/390; 252/391; 252/392
[58] Field of Search .................. 106/14.41, 14.42, 106/14.43, 14.15, 14.16; 252/390, 391, 392

[56] References Cited

U.S. PATENT DOCUMENTS

| | | | |
|---|---|---|---|
| 3,933,531 | 1/1976 | Sawa etal. | 252/390 |
| 4,373,656 | 2/1983 | Parker et al. | 427/96 |
| 4,752,027 | 6/1988 | Gschwend | 228/180.22 |
| 5,173,130 | 12/1992 | Kinoshita | 148/268 |
| 5,466,349 | 11/1995 | Tench et al. | 205/776.5 |
| 5,583,285 | 12/1996 | Hahn et al. | 73/64.52 |
| 5,679,266 | 10/1997 | Darekar et al. | 216/13 |
| 5,693,364 | 12/1997 | Kukanskis | 427/97 |
| 5,733,599 | 3/1998 | Ferrier et al. | 427/98 |

OTHER PUBLICATIONS

Pigment Handbook vol. 1, J. wiley & Sons, 1988 (selected pages) no month.

H. Zollinger, Color Chemistry, pp. 1–72, VCH Publishers, 1987 no month.

D.R. Waring et al, The Chemistry and Application of Dyes, Plenum Press 1990 no month.

M. Okawara et al; Organic Colorants, Elsner 1988 (selected pages) no month.

Artaki et al., Corrosion Protection . . . Circuit World, vol. 19, No. 3, pp. 40–45, 1993 no month.

*Primary Examiner*—Anthony Green
*Attorney, Agent, or Firm*—Juliusz Szereszewski

[57] ABSTRACT

Known organic solderability preservatives (OSP) contain an azole compound and are applied on a copper surface from an acidic solution. The OSPs are not visible to the naked eye when applied. A number of dyes compatible with the OSP solution and not interfering with solderability has been identified. The composition containing such a dye can produce a layer which is visible to the naked eye when applied even in a thin layer. The suitable dyes contain a cationic imine group having the general formula

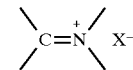

where $X^-$ is an anion such as chloride, iodide, sulphate, etc., or an organically bonded anionic group such as sulphonate.

6 Claims, No Drawings

ORGANIC SOLDERABILITY PRESERVATIVE COMPOSITIONS

FIELD OF THE INVENTION

This invention relates to compositions useful as solderability preservative coatings, and more particularly, to organic compositions useful for that purpose, based on azole compounds.

BACKGROUND OF THE INVENTION

In the printed circuit board manufacturing process, there can be a significant interval between the production of the board substrate and the soldering of the various components to its surfaces. In fact, these two operations often take place at different sites. During the period of shipment and storage of the substrates, the external copper circuitry must be protected against oxidation in order to avoid problems with the subsequent soldering. The traditional way of doing this is to apply a coat of tin-lead solder to the copper, usually in a process known as hot air solder levelling (HASL). However, because of the environmental hazards associated with lead, and the fact that tin-lead coatings do not provide the flat, planar surfaces required for surface mount assembly, there is a rapidly growing trend towards the replacement of tin-lead by organic solderability preservative (OSP) coatings. Azole-type compounds have been found to be particularly effective for this purpose, and there exist numerous patents covering various derivatives of benzotriazole, imidazole, benzimidazole, etc. U.S. Pat. No. 3,933,531 to Sawa et al., U.S. Pat. No. 4,373,656 to Parker Jr. et al. and U.S. Pat. No. 5,173,130 to Kinoshita et al. describe such exemplary coatings. OSP coatings are usually applied from a weak acid solution (referred to hereinafter as an OSP solution) through formation of a complex between the azole and the copper surface. They are much thinner than tin-lead coatings. A typical thickness is 0.3 to 0.5 µm, although some are applied at only 2 to 5 nm (see, I. Artaki et al, Circuit World, Vol. 19, No. 3, pp. 40–45, 1993).

Unlike tin-lead coatings, OSP coatings are invisible to the naked eye. This is a major disadvantage because it is impossible to know if a board has been treated, not treated or not completely treated, without resorting to destructive analysis (for example, dissolution of the coating and analysis by ultraviolet spectroscopy) or sophisticated instrumentation (for example, grazing angle infrared spectroscopy). One way of overcoming this problem is to colour the OSP coating when it is deposited. However, colour additives or dyes compatible with known OSP coatings are not readily available. To be effective, the dye must meet several criteria, namely:

(1) It must be soluble in the acidic solutions used to deposit the azole compounds.
(2) It must be absorbed from the solution and deposited on the copper surface along with the azole.
(3) During the subsequent soldering of surface components, it must not interfere with the soldering process and should preferably be removed by the solder flux.

It will certainly be appreciated that it is not practical to test thousands of various dyes, pigments and generally colouring substances to find one or more that meets the above criteria, without guidance or the benefit of hindsight.

It is an object of the present invention to provide compositions which are suitable as solderability preservative coatings for copper surfaces and are visible to the naked eye when applied on such surfaces.

It is another object of the invention to provide compositions meeting at least the above criteria (1–3).

SUMMARY OF THE INVENTION

According to the present invention, colouration of the OSP coating is achieved by adding a selected organic dye to an azole solution which is useful as a solderability preservative for a metal surface.

The number of commercially available dyes is enormous. Since the first synthetic dye was synthesized in 1865, several million coloured chemical compounds have been synthesized and about ten thousand of these were or are produced on an industrial scale. Most dyes and pigments used commercially for large-scale colouration purposes are listed in a compilation known as the *Colour Index*[10], where they are assigned a C.I. Generic Name and a C.I. Constitution Number.

Our tests on a large number of organic dyes selected from various chemical classes have shown that the vast majority do not meet the criteria given above for use with OSP coatings. Only a limited number of suitable dyes has been identified. Although many dyes are sufficiently basic to dissolve in the acidic OSP solutions, this is not enough to ensure that they are deposited on the copper surface along with the azole compound.

According to the invention, there is provided a composition useful as a solderability preservative, the composition comprising:

an azole compound suitable to provide a solderability protective layer on a metal surface, and a dye containing a cationic imine group having the general formula

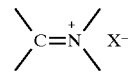

where X is an anion or an anionic group, the anion or anionic group selected such as to afford solubility of the dye in the azole compound, the deposition of the azole compound on the metal surface,.and solderability of the substrate.

This group has a carbon-nitrogen double bond with a positively charged nitrogen atom. As shown below, either the carbon atom or both the carbon and the nitrogen may be part of a ring structure. The anionic group X⁻ counterbalances the positive charge of the imine group, and may consist of either an isolated anion, such as chloride (Cl⁻), iodide (I⁻), sulphate ($SO_4^{2-}$), etc., or an anionic group attached to the main dye molecule, such as sulphonate ($-SO_3^-$).

The solubility of the dye in the azole compound is of importance. Some of the soluble dyes described herein can be converted into insoluble pigments by using complex anions such as phosphomolybdate or phosphotungstate.

The dye suitable for the purpose of the invention must also be amenable to deposition with the azole compound on a metal surface, typically copper surface. Further, the dye must be such as to enable solderability of components to the surface to which the composition is applied.

The following simple anions are suitable for the purpose of the invention:

| Chloride | Iodide | Bromide |
| --- | --- | --- |
| Sulphate | Perchlorate | Tetrafluoroborate. |

The divalent sulfate ion would counterbalance two imine groups.

Other anions or anionic groups which may be suitable for the purpose of the invention are:

| | |
| --- | --- |
| Bisulphate | Hydrogen oxalate |
| Acetate | Methyl Sulphate |
| Formate | Nitrate |
| Nitrite | Sulphite |
| Bisulphite | Phosphate |
| Oxalate | Carbonate |
| Bicarbonate | Cyanide. |
| Hydroxide. | |

The above list of anions or anionic group is by no means exhaustive and only represents suggested species.

The anionic group or anion can be attached to the main dye molecule. In this case, a common group to use is a sulphonic acid group ($-SO_3^-$) attached to an aromatic ring. The sulphonic acid group may be attached to an alkyl chain, as in Indocyanine green.

Dyes containing the cationic imine group defined above and suitable for the above-described purpose fall into two types.

The first type includes amino-substituted polyarylmethine (and related) compounds. These are described in Sections I-D-f-1 and I-D-g of P. A. Lewis (Ed.), *Pigment Handbook Vol. I, Properties and Economics*, Second Edition, John Wiley & Son, 1988; Chapter 4 of H. Zollinger, *Color Chemistry: Syntheses, Properties, and Applications of Organic Dyes And Pigments*, VCH Publishers, 1987; Chapter 2, Section IX of D. R. Waring and G. Hallas (Eds.), *The Chemistry and Application of Dyes*, Plenum Press, 1990; and Section VI of M. Okawara, T. Kitao, T. Hirashima, and M. Matsuoka, Organic Colorants: *A Handbook of Data of Selected Dyes for Electro-Optical Applications*, Elsevier, 1988. Other names used for this type of dyes are polyarylmethane, di- and triarylmethane, di- and triphenylmethane, di- and triaryl carbonium dyes. It should be noted that not all polyarylmethine dyes contain amino groups, but only those with amino groups are suitable for the present purpose. This is because such compounds can exist in different resonance structures, one of which is the cationic imine structure mentioned above. This is illustrated below for the dye Michler's Hydrol:

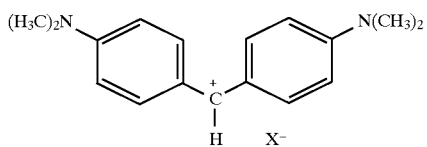
Diaryl carbonium structure

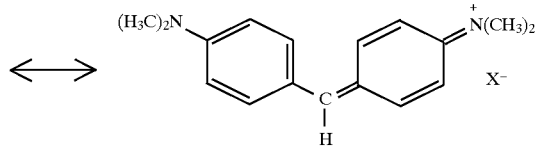
Cationic imine (quinonoid) structure

Such dyes can be represented by one of the two general structures A and B shown below (Table 1). The substituents Z and Y in structure B are illustrated in Table 2. The substituents $R_1$ to $R_{13}$ are identified by the way of example in Tables 3 and 4.

TABLE 1

General chemical structures of preferred dyes (first type).

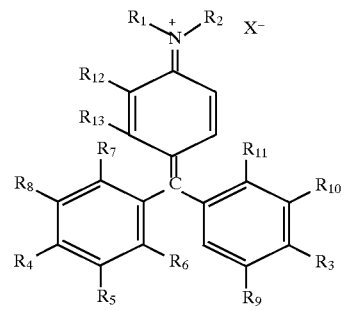

Structure A

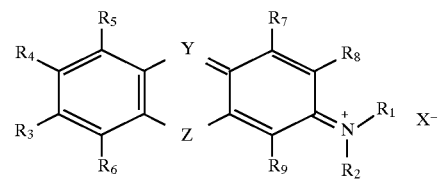

Structure B

TABLE 2

Substituents Y and Z of the Structure B

| Structure B Subclass | Y | Z |
| --- | --- | --- |
| Simple diarylmethine | C—R | —H and H— |
| Aza analogue of simple diarylmethine | N | —H and H— |
| Acridine | C—R | N—R |
| Xanthene or pyronin | C—R | O |
| Rhodamine | C—Ar | O |
| Thioxanthene or thiapyronin | C—R | S |
| Phenazine | N | N—R |
| Oxazine | N | O |
| Thiazine | N | S |

Structure A represents simple triarylmethine dyes. Structure B represents various subclasses of diarylmethine dyes depending on the groups Y and Z, as summarized in the above table. The rhodamines are xanthenes with an aryl substituent on the carbon at position Y; they may also be considered as triarylmethines with an oxygen bridge (Structure A with $R_7$, $R_{13}$=—O—).

It will be understood by a person skilled in organic chemistry that the definition "—H and H—" in column Z of Table 2 defines a broken chain at the Z site, with two hydrogen atoms occupying the two resulting valencies.

A number of common dyes based on Structures A and B are listed in Tables 3 and 4 respectively. This is by no means an exhaustive list and many others also exist with other substituents.

The second general type of suitable dyes is known as polymethines or cyanines. These are described in Chapter 3 of H. Zollinger, *Color Chemistry: Syntheses, Properties, and Applications of Organic Dyes and Pigments*, VCH Publishers, 1987; Chapter 2, Section VII of D. R. Waring and G. Hallas (Eds.), *The Chemistry and Application of Dyes*, Plenum Press, 1990; and Section VII of M. Okawara, T. Kitao, T. Hirashima, and M. Matsuoka, *Organic Colorants: A Handbook of Data of Selected Dyes for Electro-Optical Applications*, Elsevier, 1988. Dyes of this type that are suitable for OSP use contain a ring with a C=N$^+$ bond that is conjugated with an external double bond. The latter may be carbon-carbon, carbon-nitrogen, or nitrogen-nitrogen, as represented by the following general structures:

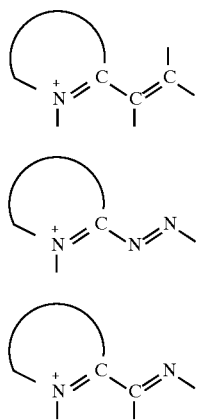

Some examples of dyes belonging to this type are given in Table 5. As before, this is by no means an exhaustive list and many other analogues are available. The yellow and orange ones would be least preferred because of their similarity to the copper.

It should be noted that the suitability of a particular dye from either of the classes described will depend on its solubility in the OSP solution. The OSP products that are commercially available vary in composition and acidity, so a given dye may be soluble in some products but not in others. The solubility will depend on the nature of the chemical substituents and on the degree of acidity of the OSP solution, so it is difficult to predict whether or not a particular dye will be sufficiently soluble. Generally speaking, we have found that the presence of sulphonic acid group substituents (—SO$_3$H, —SO$_3$—) tends to reduce the solubility in general, but it does not always mean that the product is insoluble.

Overall, the collection of dyes covered by the invention covers a wide spectrum of colours, including red, pink, orange, yellow, green, blue, and purple.

The method of applying the dye consists of dissolving it in the OSP treatment solution before the copper surfaces are immersed. The amount required depends on the particular dye and on the degree of colouration desired, but falls within the range of 0.001 to 10 grams per liter of solution, preferably 0.01 to 1 g/L, and most preferably 0.05 to 0.5 g/L. The latter range usually gives a definite colouration of the surface but does not interfere with soldering.

As mentioned above, the azole compound may be any commercially known compound suitable for the purpose of the invention, e.g. a compound as described in U.S. Pat. Nos. 3,933,531; 4,373,656; or 5,173,130 the specifications whereof are being incorporated herewith by reference.

EXAMPLE 1

Test coupons with dimensions 5 cm×3 cm were prepared from typical materials used in circuit board fabrication, namely FR4 glass-epoxy composite as substrate and a surface layer of copper of thickness 35 μm.

These were treated with commercial products from Enthone-OMI Inc. according to the recommended procedure, except for the addition of colourant. The procedure comprised the following steps:

1. Acid clean by immersion in Enplate® PC-471 at 100° F. for 2 minutes
2. Rinse for 2 minutes
3. Microetch by immersion in Enplate® AD-485 at room temperature for 1 minute
4. Rinse for 1 minute
5. Immerse in 10% sulphuric acid at room temperature for 1 minute
6. Rinse for 1 minute
7. Deposit OSP coating by immersion in Entek® Plus CU-106A solution with added dye at 110° F. for 1 minute
8. Remove and hold at room temperature for 2 minutes
9. Dry with forced air Step 7 is the stage at which the protective azole coating is deposited. For this step, the dye "Brilliant Green" (Aldrich Chemical Co., Cat. No. 86,087–5) was dissolved beforehand in the Entek® Plus CU-106A solution at a concentration of 0.5 g/L.

The resulting coupon had a definite green colour which was stable over at least several months and did not impair soldering.

EXAMPLE 2

In this example, similar test coupons were treated using the OSP product Glicoat-SMD (E2) from Shikoku Chemicals Corporation. The treatment procedure was as follows:

1. Acid clean at room temperature for 5 minutes
2. Rinse for 1 minute
3. Microetch at room temperature for 2 minutes
4. Rinse for 1 minute
5. Air dry
6. Deposit OSP coating by immersion in Glicoat-SMD (E2) solution with added dye at 40° C. for 1 minute
7. Rinse for 1 minute
8. Air dry
9. Oven dry at 100° C. for 5 minutes For step 6, the dye "Lissamine Green B" (Aldrich Chemical Co., Cat. No. 19,958-3) was dissolved beforehand in the Glicoat-SMD (E2) solution at a concentration of 0.2 g/L.

The resulting coupon had a definite blue colour which was stable for at least several months and did not impair soldering.

TABLE 3

Some common dyes based on Structure A of Table 1

| Dye | $R_1$ | $R_2$ | $R_3$ | $R_4$ | Other R (equal to —H if not specified below) |
|---|---|---|---|---|---|
| Acid Violet 17 | $-C_2H_5$ | $-CH_2-C_6H_4-SO_3^-$ | $-N(C_2H_5)-CH_2-C_6H_4-SO_3Na$ | $-N(C_2H_5)_2$ | |
| Alkali Blue 6B (Acid Blue 110) | —H | $-C_6H_4-SO_3^-$ | $-NH-C_6H_5$ | $-NH-C_6H_5$ | $R_{12} = -CH_3$ |
| Alphazurine A (Acid Blue 7, Patent Blue A) | $-C_2H_5$ | $-CH_2-C_6H_5$ | $-N(C_2H_5)-CH_2-C_6H_5$ | $-SO_3Na$ | $R_7 = -SO_3^-$ |
| Aniline Blue | —H | $-C_6H_4-SO_3^-$ | $-NH-C_6H_4-SO_3Na$ | $-NH-C_6H_4-SO_3Na$ | |
| Basic Red 9 (Pararosaniline, Basic Fuchsin) | —H | —H | $-NH_2$ | $-NH_2$ | |
| Basic Violet 14 (Rosaniline, Basic Fuchsin) | —H | —H | $-NH_2$ | $-NH_2$ | $R_{10} = -CH_3$ |
| Basic Violet 23 | $-CH_3$ | $-CH_3$ | $-N(CH_3)_2$ | $-N(CH_3)_2$ | $R_7 = -CH_3$ |
| Brilliant Blue G (Acid Blue 90) | $-C_2H_5$ | $-CH_2-C_6H_4-SO_3^-$ | $-N(C_2H_5)-CH_2-C_6H_4-SO_3Na$ | $-NH-C_6H_4-OC_2H_5$ | $R_{11} = R_{13} = -CH_3$ |
| Brilliant Blue R (Acid Blue 83) | $-C_2H_5$ | $-CH_2-C_6H_4-SO_3^-$ | $-N(C_2H_5)-CH_2-C_6H_4-SO_3Na$ | $-NH-C_6H_4-OC_2H_5$ | |
| Brilliant Green (Basic Green 1) | $-C_2H_5$ | $-C_2H_5$ | $-N(C_2H_5)_2$ | —H | |
| Crystal Violet (Basic Violet 3, Gentian Violet) | $-CH_3$ | $-CH_3$ | $-N(CH_3)_2$ | $-N(CH_3)_2$ | |
| Erioglaucine (Acid Blue 9, Alphazurine FG) | $-C_2H_5$ | $-CH_2-C_6H_4-SO_3^-$ | $-N(C_2H_5)-CH_2-C_6H_4-SO_3Na$ | —H | $R_7 = -SO_3Na$ |
| Ethyl Violet (Basic Violet 4) | $-C_2H_5$ | $-C_2H_5$ | $-N(C_2H_5)_2$ | $-N(C_2H_5)_2$ | |
| Fast Green FCF | $-C_2H_5$ | $-CH_2-C_6H_4-SO_3^-$ | $-N(C_2H_5)-CH_2-C_6H_4-SO_3Na$ | —OH | $R_7 = -SO_3Na$ |

TABLE 3-continued

Some common dyes based on Structure A of Table 1

| Dye | $R_1$ | $R_2$ | $R_3$ | $R_4$ | Other R (equal to —H if not specified below) |
|---|---|---|---|---|---|
| Guinea Green B (Acid Green 3) | —$C_2H_5$ | —$CH_2$—$C_6H_4$—$SO_3^-$ | —N($CH_2$—$C_6H_4$—$SO_3Na$)($C_2H_5$) | —H | |
| Lissamine Green B (Acid Green 50, Wool Green S) | —$CH_3$ | —$CH_3$ | —N($CH_3$)$_2$ | —H | $R_{5-6}$ = 3,4-dimethylphenyl-SO$_3$Na; $R_7$ = —OH; $R_8$ = —SO$_3^-$ |
| Malachite Green (Basic Green 4) | —$CH_3$ | —$CH_3$ | —N($CH_3$)$_2$ | —H | |
| Methyl Green (Ethyl Green) | —$CH_3$ | —$CH_3$ | —N($CH_3$)$_2$($C_2H_5$)$^+$Cl$^-$ | —N($CH_3$)$_2$ | |
| Methyl Violet 2B (Basic Violet 1) | —$CH_3$ | —$CH_3$ | —N($CH_3$)$_2$ | —NH$CH_3$ | |
| Naphthalene Green V (Acid Green 16) | —$CH_3$ | —$CH_3$ | —N($CH_3$)$_2$ | —H | $R_{5-6}$ = 3,4-dimethylphenyl-SO$_3$Na; $R_8$ = —SO$_3^-$ |
| New Fuchsin (Basic Violet 2) | —H | —H | —NH$_2$ | —NH$_2$ | $R_8$ = $R_{10}$ = $R_{12}$ = —$CH_3$ |
| Patent Blue VF (Acid Blue 1, Sulphan Blue) | —$C_2H_5$ | —$C_2H_5$ | —N($C_2H_5$)$_2$ | —SO$_3$Na | $R_6$ = —SO$_3^-$ |
| Setocyanine (Basic Blue 5B) | —H | —$C_2H_5$ | —NH$C_2H_5$ | —H | $R_6$ = —Cl; $R_9$ = $R_{12}$ = —$CH_3$ |
| Setoglaucine (Basic Blue 6G) | —$CH_3$ | —$CH_3$ | —N($CH_3$)$_2$ | —H | $R_6$ = —Cl |
| Victoria Blue B (Basic Blue 26) | —$CH_3$ | —$CH_3$ | —N($CH_3$)$_2$ | —NH—$C_6H_5$ | $R_{5-6}$ = 2,3-dimethylphenyl |
| Victoria Blue R (Basic Blue 11) | —$CH_3$ | —$CH_3$ | —N($CH_3$)$_2$ | —NH$C_2H_5$ | $R_{5-6}$ = 2,3-dimethylphenyl |
| Victoria Pure Blue BO (Basic Blue 7) | —$C_2H_5$ | —$C_2H_5$ | —N($C_2H_5$)$_2$ | —NH$C_2H_5$ | $R_{5-6}$ = 2,3-dimethylphenyl |
| Xylene Cyanole FF (Acid Blue 147) | —H | —$C_2H_5$ | —NH$C_2H_5$ | —SO$_3$Na | $R_7$ = —SO$_3^-$; $R_9$ = —$CH_3$ |

TABLE 4

Some common dyes based on Structure B of Table 1

| Dye | Y | Z | $R_1$ | $R_2$ | $R_3$ | Other R (equal to H if not specified below) |
|---|---|---|---|---|---|---|
| Michler's Hydrol | H–C(H)– | –H, H– | –CH$_3$ | –CH$_3$ | –N(CH$_3$)$_2$ | |
| Auramine O | NH$_2$–C(H)– | –H, H– | –CH$_3$ | –CH$_3$ | –N(CH$_3$)$_2$ | |
| Acridine Orange (Basic Orange 14) | H–C(H)– | N–H | –CH$_3$ | –CH$_3$ | –N(CH$_3$)$_2$ | |
| Pyronin Y | H–C(H)– | O | –CH$_3$ | –CH$_3$ | –N(CH$_3$)$_2$ | |
| Pyronin B | H–C(H)– | O | –C$_2$H$_5$ | –C$_2$H$_5$ | –N(C$_2$H$_5$)$_2$ | |
| Rhodamine B (Basic Violet 10) | C-(2-COOH-phenyl) | O | –C$_2$H$_5$ | –C$_2$H$_5$ | –N(C$_2$H$_5$)$_2$ | |
| Rhodamine 6G (Basic Red 1) | C-(2-COOC$_2$H$_5$-phenyl) | O | –H | –C$_2$H$_5$ | –NHC$_2$H$_5$ | $R_4 = R_8 = -CH_3$ |
| Rhodamine 123 | C-(2-COOCH$_3$-phenyl) | O | –H | –H | –NH$_2$ | |
| Sulforhodamine B (Acid Red 52) | C-(2-SO$_3^-$,4-SO$_3$Na-phenyl) | O | –C$_2$H$_5$ | –C$_2$H$_5$ | –N(C$_2$H$_5$)$_2$ | |
| Sulforhodamine G (Acid Red 50) | C-(2-SO$_3^-$,4-SO$_3$Na-phenyl) | O | –H | –C$_2$H$_5$ | –NHC$_2$H$_5$ | $R_4 = R_8 = -CH_3$ |
| Violamine R (Acid Violet 9) | C-(2-COONa-phenyl) | O | –H | 3,4-dimethylphenyl-SO$_3^-$ (–CH$_3$ substituted) | –NH–(2-methylphenyl) | |
| Bindschedler's Green | N | –H, H– | –CH$_3$ | –CH$_3$ | –N(CH$_3$)$_2$ | |
| Basic Blue 3 (Maxilon Blue 5G) | N | O | –C$_2$H$_5$ | –C$_2$H$_5$ | –N(C$_2$H$_5$)$_2$ | |
| Brilliant Cresyl Blue ALD | N | O | –C$_2$H$_5$ | –C$_2$H$_5$ | –NH$_2$ | $R_4 = -CH_3$ |

TABLE 4-continued

Some common dyes based on Structure B of Table 1

| Dye | Y | Z | $R_1$ | $R_2$ | $R_3$ | Other R (equal to H if not specified below) |
|---|---|---|---|---|---|---|
| Celestine Blue (Mordant Blue 14) | N | O | $-C_2H_5$ | $-C_2H_5$ | $-OH$ | $R_5 = -CONH_2$; $R_6 = -OH$ |
| Cresyl Violet | N | O | $-H$ | $-H$ | $-NH_2$ | $R_{7-8} =$ (benzo-fused ring) |
| Darrow Red | N | O | $-H$ | $-H$ | $-NHCOCH_3$ | $R_{7-8} =$ (benzo-fused ring) |
| Gallocyanine | N | O | $-CH_3$ | $-CH_3$ | $-OH$ | $R_5 = -COOH$; $R_6 = -OH$ |
| Meldola's Blue (Basic Blue 6) | N | O | $-CH_3$ | $-CH_3$ | $-H$ | $R_{4-5} =$ (benzo-fused ring) |
| Nile Blue (Basic Blue 12) | N | O | $-C_2H_5$ | $-C_2H_5$ | $-NH_2$ | $R_{4-5} =$ (benzo-fused ring) |
| Azure A | N | S | $-CH_3$ | $-CH_3$ | $-NH_2$ | |
| Azure B | N | S | $-CH_3$ | $-CH_3$ | $-NHCH_3$ | |
| Azure C | N | S | $-H$ | $-CH_3$ | $-NH_2$ | |
| Methylene Blue (Basic Blue 9) | N | S | $-CH_3$ | $-CH_3$ | $-N(CH_3)_2$ | |
| Methylene Green (Basic Green 5) | N | S | $-CH_3$ | $-CH_3$ | $-N(CH_3)_2$ | $R_9 = -NO_2$ |
| New Methylene Blue N (Basic Blue 24) | N | S | $-H$ | $-C_2H_5$ | $-NHC_2H_5$ | $R_4 = R_8 = -CH_3$ |
| Toluidine Blue O (Basic Blue 17) | N | S | $-CH_3$ | $-CH_3$ | $-NH_2$ | $R_4 = -CH_3$ |
| Neutral Red (Basic Red 5) | N | N-H | $-CH_3$ | $-CH_3$ | $-NH_2$ | $R_4 = -CH_3$ |
| Safranine O | N | N | $-H$ | $-H$ | $-NH_2$ | $R_4 = R_8 = -CH_3$ |
| Indoine Blue (Basic Blue 16) | N | N | $-H$ | $-H$ | (2-hydroxy-1-naphthylazo group) | $R_4 = R_8 = -CH_3$ |
| Azocarmine B | N | N (phenyl) | $-H$ | (methyl-sulfonated phenyl with $SO_3Na$ and $SO_3^-$) | $-H$ | $R_{7-8} =$ (methyl-sulfonated benzo ring, $-SO_3Na$) |

TABLE 4-continued

Some common dyes based on Structure B of Table 1

| Dye | Y | Z | R₁ | R₂ | R₃ | Other R (equal to H if not specified below) |
|---|---|---|---|---|---|---|
| Janus Green B | N | N-phenyl | —C₂H₅ | —C₂H₅ | —N=N—C₆H₄—N(CH₃)₂ | |

TABLE 5

Some examples of suitable dyes from the polymethine class 1,1'-Diethyl-2,2'-quinotricarbocyanine iodide 2-[4-(Dimethylamino)styryl]-1-ethylpyridinium iodide Quinaldine Red Indocyanine Green Basic Red 12

Astrazon Orange G (Basic Orange 21)

Maxilon Yellow 5G (Basic Yellow 11)

Astrazon Golden Yellow GL (Basic Yellow 28)

Basic Blue 41

Basic Blue 66 (Atacryl Blue LLB)

TABLE 5-continued

Some examples of suitable dyes from the polymethine class

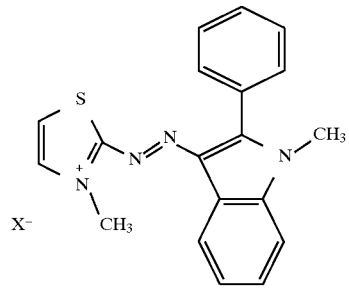 Basic Red 29

We claim:

1. A composition for preserving solderability of a metal surface, the composition comprising
   an azole compound effective to provide a solderability protective layer on a metal surface, and
   a dye containing a cationic imine group having the general formula

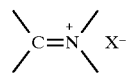

where $X^-$ is an anion or an anionic group, the anion or anionic group selected to afford a solubility of the dye in the azole compound, the deposition of the azole compound on the metal surface, and solderability of the metal surface.

2. The composition of claim 1 wherein the dye has a chemical structure represented by the general formula A of Table 1, the substituents $R_1$ to $R_{13}$ being selected from Table 3 respectively.

3. The composition of claim 1 wherein the dye has a chemical structure represented by the general formula B of Table 1, the substituents Y, Z and $R_1$–$R_9$ being selected from Table 4 respectively.

4. The composition of claim 1 wherein the dye has a chemical structure represented by one of the general formulae

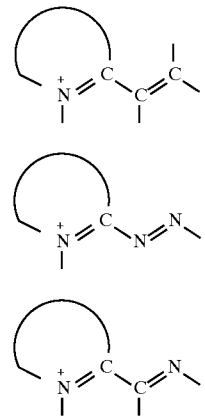

5. The composition of claim 4 wherein the dye has a chemical structure selected from the group listed in Table 5.

6. The composition of claim 1 wherein the anion or anionic group is selected from the group consisting of chloride, iodide, bromide, sulphate, perchlorate, tetrafluoroborate, bisulphate, hydrogen oxalate, acetate, methyl sulphate, formate, nitrate, nitrite, sulphite, bisulphite, phosphate, oxalate, carbonate, bicarbonate, cyanide, and hydroxide.

* * * * *